United States Patent
Li et al.

(10) Patent No.: US 6,949,325 B2
(45) Date of Patent: Sep. 27, 2005

(54) NEGATIVE RESIST COMPOSITION WITH FLUOROSULFONAMIDE-CONTAINING POLYMER

(75) Inventors: Wenjie Li, Poughkeepsie, NY (US); Pushkara Rao Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/663,553

(22) Filed: Sep. 16, 2003

(65) Prior Publication Data

US 2005/0058930 A1 Mar. 17, 2005

(51) Int. Cl.$^7$ ............................................... G03C 1/73
(52) U.S. Cl. ............................... 430/270.1; 430/271.1; 430/272.1; 430/275.1; 430/283.1; 430/311; 430/313; 430/317; 430/318; 430/907; 430/927; 430/906; 525/326.2; 525/328.2; 525/328.5
(58) Field of Search .......................... 430/270.1, 271.1, 430/272.1, 275.1, 283.1, 311, 313, 317, 318, 907, 927, 906

(56) References Cited

U.S. PATENT DOCUMENTS

| | | | |
|---|---|---|---|
| 6,165,678 A | 12/2000 | Allen et al. | |
| 6,177,228 B1 | 1/2001 | Allen et al. | |
| 6,235,849 B1 | 5/2001 | Jayaraman et al. | |
| 6,277,750 B1 | 8/2001 | Pawlowski et al. | |
| 6,344,305 B1 | 2/2002 | Lin et al. | |
| 6,410,748 B1 | 6/2002 | Shida et al. | |
| 6,420,503 B1 * | 7/2002 | Jayaraman et al. | 526/257 |
| 2002/0115017 A1 | 8/2002 | Angelopoulos et al. | |
| 2004/0161698 A1 * | 8/2004 | Kanagasabapathy et al. | 430/270.1 |

* cited by examiner

Primary Examiner—Roberto Rabago
(74) Attorney, Agent, or Firm—Steve Capella

(57) ABSTRACT

A negative resist composition is disclosed, wherein the resist composition includes a polymer having at least one fluorosulfonamide monomer unit having one of the following two formulae:

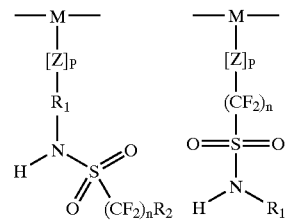

wherein: M is a polymerizable backbone moiety; Z is a linking moiety selected from the group consisting of —C(O)O—, —C(O)—, —OC(O)—, —O—C(O)—C(O)—O—, or alkyl; P is 0 or 1; $R_1$ is a linear or branched alkyl group of 1 to 20 carbons; $R_2$ is hydrogen, fluorine, a linear or branched alkyl group of 1 to 6 carbons, or a semi- or perfluorinated linear or branched alkyl group of 1 to 6 carbons; and n is an integer from 1 to 6. A method of forming a patterned material layer on a substrate is also disclosed, wherein the method includes applying the fluorosulfonamide-containing resist composition to the substrate to form a resist layer on the material layer; patternwise exposing the resist layer to imaging radiation; removing portions of the resist layer not exposed to the imaging radiation to create spaces in the resist layer corresponding to the pattern; and removing portions of the material layer at the spaces formed in the resist layer, thereby forming a patterned material layer.

27 Claims, No Drawings

NEGATIVE RESIST COMPOSITION WITH FLUOROSULFONAMIDE-CONTAINING POLYMER

FIELD OF THE INVENTION

The present invention relates to a resist composition and, more particularly, to a negative resist composition that includes a polymer having at least one monomer unit that contains a fluorosulfonamide structure.

BACKGROUND OF THE INVENTION

In the manufacture of patterned devices such as semiconductor chips and chip carriers, the steps of etching different layers which constitute the finished product are among the most critical and crucial steps involved.

In semiconductor manufacturing, optical lithography has been the main stream approach to pattern semiconductor devices. In typical prior art lithography processes, UV light is projected onto a silicon wafer coated with a layer of photosensitive resist through a mask that defines a particular circuitry pattern. Exposure to UV light, followed by subsequent baking, induces a photochemical reaction, which changes the solubility of the exposed regions of the photosensitive resist. Thereafter, an appropriate developer, typically an aqueous base solution, is used to selectively remove the resist either in the exposed regions (positive-tone resists) or in the unexposed region (negative-tone resists). The pattern thus defined is then imprinted on the silicon wafer by etching away the regions that are not protected by the resist with a dry or wet etch process.

Resists are generally comprised of a polymeric matrix, a radiation sensitive component, a casting solvent, and other performance enhancing additives. The polymeric portion of the resist should have a reasonable absorption at exposure wavelengths, and the resist composition must also possess suitable chemical and mechanical properties to enable transfer of the image from the patterned resist to an underlying substrate layer(s). Thus, an important parameter to be considered in the design of a resist material is the dissolution behavior of the material in the given developer. A patternwise exposed negative resist must be capable of appropriate dissolution response (i.e., selective dissolution in developer of unexposed areas) to yield the desired resist structure. The industry has largely supported the use of 0.263 N tetramethyl ammonium hydroxide (TMAH) as a developer for resist.

For a negative photoresist to work, the resist should have a reasonable dissolution rate before exposure and little or no dissolution after exposure. To achieve the required dissolution rate in aqueous base developer, acidic groups have been incorporated into the polymer structure. For example, hydroxystyrene has been widely used as such an acidic group in negative resist designed for use with irradiation at a wavelength of 248 nm. Hydroxystyrene, however, is too absorbing at 193 nm wavelength. Other acidic groups such as carboxylic acid (—COOH) and hexafluoroalcohol (HFA) have been used in 193 nm negative resist design. Carboxylic acid, however, is too acidic. Resist polymers with —COOH tend to dissolve very fast in 0.263 N TMAH developer before exposure and swell after exposure, which largely deteriorates the lithographic performance of the resist. The HFA group has a much weaker acidity than —COOH, and resists based on HFA have better dissolution properties. On the other hand, due to the high fluorine content in the HFA group, the etch resistance is often a concern.

Thus, there remains a need in the art for a negative resist composition that exhibits excellent dissolution response in aqueous base developer, and yet overcomes the above-mentioned problems associated with prior art resist compositions.

SUMMARY OF THE INVENTION

Accordingly, the present invention is directed to a negative-tone resist composition comprising a polymer, the polymer comprising at least one fluorosulfonamide monomer unit having one of the following two formulae:

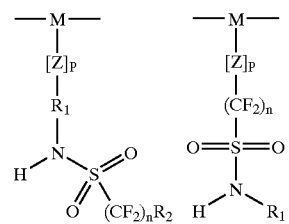

wherein: M is a polymerizable backbone moiety; Z is a linking moiety selected from the group consisting of —C(O)O—, —C(O)—, —OC(O)—, —O—C(O)—C(O)—O—, or alkyl; P is 0 or 1; $R_1$ is a linear or branched alkyl group of 1 to 20 carbons; $R_2$ is hydrogen, fluorine, a linear or branched alkyl group of 1 to 6 carbons, or a semi- or perfluorinated linear or branched alkyl group of 1-to 6 carbons; and n is an integer from 1 to 6. The resist composition of the invention may further comprise any one of a solvent, a radiation sensitive acid generator, a crosslinking agent, a quencher, and a surfactant.

In another aspect, the invention is directed to a method of forming a patterned material layer on a substrate, the method comprising: (a) providing a substrate having a material layer on a surface; (b) applying the resist composition mentioned above to the substrate to form a resist layer on the material layer; (c) patternwise exposing the resist layer to imaging radiation; (d) removing portions of the resist layer not exposed to the imaging radiation in step (c) to create spaces in the resist layer corresponding to the pattern; and (e) removing portions of the material layer at the spaces formed in step (d), thereby forming the patterned material layer.

DETAILED DESCRIPTION OF THE INVENTION

The present invention is directed to a negative resist composition which comprises a polymer, the polymer comprising at least one monomer unit which includes a fluorosulfonamide group. Resist polymers with these fluorosulfonamide groups contain less fluorine than prior art resist polymers which include HFA, a feature which improves etch resistance of the resist material. Also, the fluorosulfonamide group of the invention has a stronger acidity than the HFA group used in prior art resists. Therefore, in order to achieve the same dissolution rate in developer as prior art resists containing HFA, a lower concentration of the fluorosulfonamide group may be used in the resist polymer of the invention, further improving the etch resistance.

The invention is specifically directed to a negative resist composition comprising a polymer which comprises at least one fluorosulfonamide monomer unit preferably having one of the following two formulae:

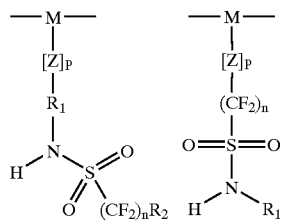

wherein: M is a polymerizable backbone moiety; Z is a linking moiety selected from the group consisting of —C(O)O—, —C(O)—, —OC(O)—, —O—C(O)—C(O)—O—, or alkyl; P is 0 or 1; $R_1$ represents a linear or branched alkyl group of 1 to 20 carbons; $R_2$ represents hydrogen, fluorine, a linear or branched alkyl group of 1 to 6 carbons, or a semi- or perfluorinated linear or branched alkyl group of 1 to 6 carbons; and n is an integer from 1 to 6.

Examples of the polymerizable backbone moiety, M, include:

where $R_3$ represents hydrogen, a linear or branched alkyl group of 1 to 20 carbons, a semi- or perfluorinated linear or branched alkyl group of 1 to 20 carbons, or CN; and

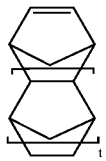

where t is an integer from 0 to 3.

Examples of suitable fluorosulfonamide monomers include:

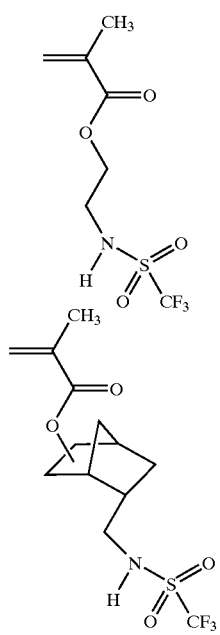

(I)

(II)

-continued

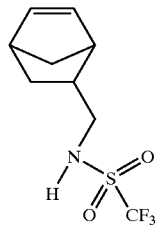

(III)

The polymer may further comprise a co-monomer unit which can participate in reactions which render the polymer insoluble in developer, such as a crosslinking co-monomer unit. Examples of such co-monomer units include:

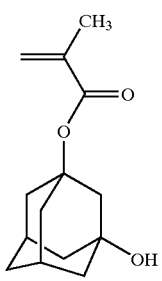

(IV)

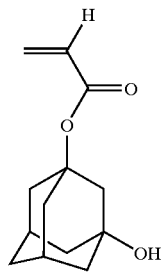

(V)

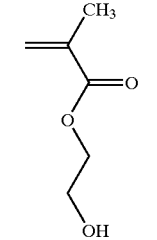

(VI)

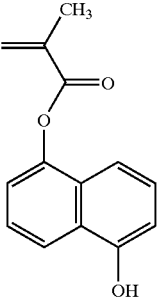

(VII)

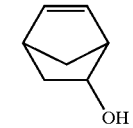

(VIII)

-continued (IX) 

(X) 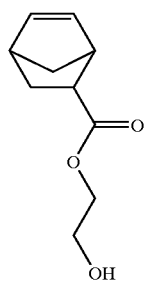

(XI) 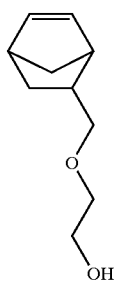

(XII) 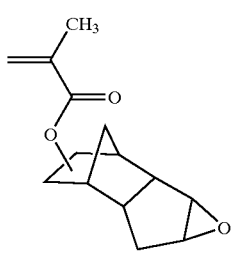

(XIII) 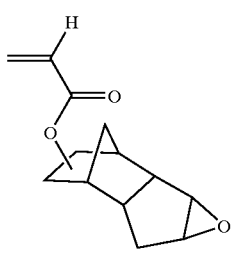

(XIV) 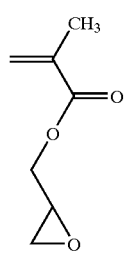

(XV) 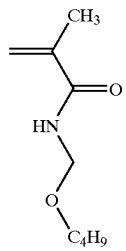

(XVI) 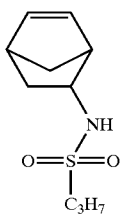

The negative resist composition of the invention may further comprise any one of a solvent, a radiation sensitive acid generator, a crosslinking agent, a quencher, and a surfactant.

Solvents well known to those skilled in the art may be employed in the resist formulation of the invention. Such solvents are used to dissolve the fluorosulfonamide-containing polymer and other components of the resist composition. Illustrative examples of such solvents include, but are not limited to: ethers, glycol ethers, aromatic hydrocarbons, ketones, esters and the like. Preferred solvents include propylene glycol monomethyl ether acetate, ethyl lactate, γ-butyrolactone, and cyclohexanone. Any of these solvents may be used singly or in the form of a mixture of two or more.

The radiation sensitive acid generators, also known as photoacid generators, which may be used in the resist composition of the invention are compounds which will generate an acid upon exposure to energy. Any suitable photoacid generating agent may be used so long as a mixture of the aforementioned resist composition of the present invention and the photoacid generator dissolves sufficiently in an organic solvent and the resulting solution thereof can form a uniform film by a film-forming process such as spin coating or the like. Illustrative classes of such acid generators that can be employed in the present invention include, but are not limited to: onium salts, succinimide derivatives, diazo compounds, nitrobenzyl compounds, and the like. To minimize acid diffusion for high resolution capability, the acid generators should be such that they generate bulky acids upon exposure to energy. These bulky acids contain at least 4 carbon atoms. A preferred acid generator employed in the present invention is an onium salt, such as an iodonium salt or a sulfonium salt, and/or a succinimide derivative. Preferred acid generators include 4-(1-butoxynaphthyl) tetrahydrothiophenium perfluorobutanesulfonate, triphenyl sulfonium perfluorobutanesulfonate, t-butylphenyl diphenyl sulfonium perfluorobutanesulfonate, 4-(1-butoxynaphthyl) tetrahydrothiophenium perfluorooctanesulfonate, triphenyl sulfonium perfluorooctanesulfonate, t-butylphenyl diphenyl sulfonium perfluorooctanesulfonate, di(t-butylphenyl)

iodonium perfluorobutane sulfonate, di(t-butylphenyl) iodonium perfluorohexane sulfonate, di(t-butylphenyl) iodonium perfluoroethylcyclohexane sulfonate, di(t-buylphenyl) iodonium camphoresulfonate, and perfluorobutylsulfonyloxybicylo[2.2.1]-hept-5-ene-2,3-dicarboximide. Any of these photoacid generators may be used singly or in the form of a mixture of two or more.

The specific photoacid generator selected will depend on the irradiation being used for patterning the resist. Photoacid generators are currently available for a variety of different wavelengths of light from the visible range to the X-ray range; thus, imaging of the resist can be performed using deep-UV, extreme-UV, e-beam, laser or any other irradiation source deemed useful.

The crosslinking agents used in the invention may be a single compound or a combination of two or more compounds that generate stable carbocations in the presence of photogenerated acid to crosslink the sulfonamide-containing polymer. Typical crosslinking agents are any compound containing more than one of the following unit:

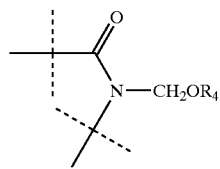

where $R_4$ represents hydrogen, or a linear or branched alkyl group, or an aromatic group.

The preferred crosslinking agents are glycouril and derivatives thereof having the formula:

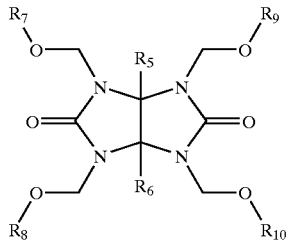

where $R_5$–$R_{10}$ each represent hydrogen, or a linear or branched alkyl group, preferably an alkyl group of 1 to 8 carbons, or an aromatic group, preferably an aryl hydrocarbon group of 6 to 9 carbons. Preferred crosslinking agents include tetramethoxylmethyl glycouril (Powderlink, available from Cytec), methylpropyl Powderlink, and methylphenyl Powderlink. Combinations of two or more of these crosslinking agents may also be used as crosslinking agents.

The quenchers that can be employed in the invention are weak bases which scavenge trace acids while not having an excessive impact on the performance of the negative-tone resist. Illustrative examples of quenchers include aromatic or aliphatic amines such as 2-phenylbenzimidazole or t-alkyl ammonium hydroxides such as t-butyl ammonium hydroxide (TBAH).

The surfactants that can be employed in the invention are those that are capable of improving the coating homogeneity of the negative-tone resist compositions of the invention. Illustrative examples of such surfactants include fluorine-containing surfactants such as 3M's FC-430 and siloxane-containing surfactants such as Union Carbide's SILWET series and the like.

The resist composition of the invention may contain (i) about 1 to about 30 wt. % of the sulfonamide-containing polymer, more preferably about 5 to about 15 wt. %, (ii) about 1 to about 30 wt. % of crosslinking agent, based on the total weight of the polymer, more preferably about 3 to about 10 wt. %, (iii) about 0.5 to about 20 wt. % of photoacid generator, based on the total weight of the polymer, more preferably about 0.5 to about 10 wt. %, and (IV) a solvent, which is typically present in amounts of about 70 to about 99 wt. % of the composition. The resist composition may further contain a quencher, which is typically present in amounts of about 0.1 to about 1.0 wt. % based on the total weight of the polymer, and a surfactant, which is typically present in amounts of about 0.001 to about 0.1 wt. % based on the total weight of the polymer.

In another aspect of the invention, the sulfonamide-containing resist composition may be used as an imaging layer in the manufacture of semiconductor devices. The sulfonamide-containing imaging layer is applied by known means, such as spin-coating to a desired substrate. The substrate with the resist is then preferably baked (pre-exposure bake) to remove the solvent and improve the coherence of the resist layer. Typical pre-exposure baking temperature is about 80 to about 150° C. Typical resist thickness is about 100 to about 500 nm.

The imaging layer is then exposed to an appropriate irradiation source. This is followed by post-exposure baking and development in an aqueous base developer, such as 0.263 N TMAH developer.

The pattern from the resist structure may then be transferred to the material (e.g., ceramic, dielectric, metal or semiconductor) of the underlying substrate. Typically, the transfer is achieved by reactive ion etching or some other etching technique. The resist composition of the invention and resulting resist structures may be used to create patterned material layer structures such as metal wiring lines, holes for contacts or vias, insulation sections (e.g., damascene trenches or shallow trench isolation), trenches for capacitor structures, etc. as might be used in the design of integrated circuit devices.

The processes for making these (ceramic, dielectric, metal or semiconductor) features generally involve providing a material layer or section of the substrate to be patterned, applying a layer of resist over the material layer or section, patternwise exposing the resist to radiation, developing the pattern by contacting the exposed resist with a developer, etching the layer(s) underlying the resist layer at spaces in the pattern whereby a patterned material layer or substrate section is formed, and removing any remaining resist from the substrate. In some instances, a hard mask may be used below the resist layer to facilitate transfer of the pattern to a further underlying material layer or section. It should be understood that the invention is not limited to any specific lithography technique or device structure.

The following non-limiting examples are provided to further illustrate the present invention. Because these examples are provided for illustrative purposes only, the invention embodied therein should not be limited thereto.

EXAMPLE 1

Synthesis of 2-trifluoromethanesulfonylaminoethyl methacrylate (I)

To a solution of 15 g (0.091 mol) of 2-aminoethyl methacrylate hydrochloride (available from Aldrich) in 250 ml of anhydrous methylene chloride was added 18.4 g of redistilled triethylamine (0.182 mol). After the mixture was stirred at room temperature for 1 hour, 15.3 g trifluoromethane sulfonylchloride (0.091 mol) was added. The resulting mixture was further stirred at room temperature overnight. About 200 ml ether was added. The mixture was filtered to remove the precipitate formed. The filtrate was sequentially washed with 2×100 ml of 5% HCl, 100 ml of saturated NaHCO$_3$, 2×100 ml brine, and then dried over MgSO$_4$. The solvents were removed by rotavap. About 14.5 g of viscous liquid was obtained. The product was further purified by recrystallization from 1:1 hexane/chloroform to give about 12 g white solid (51%) having a melting point of 55–58° C.

EXAMPLE 2

Synthesis of Poly(I-co-IV)

0.148 g (0.0009 mol) of 2,2'-azobisisobutyronitrile (AIBN) was added to a solution of 4.7 g (0.018 mol) of 2-trifluoromethanesulfonylaminoethyl methacrylate (I), 2.83 g (0.012 mol) of hydroxyadamantyl methacrylate (IV), and 0.061 g (0.0003 mol) dodecanethiol in 22.6 g of 2-butanone. The solution was deoxygenated by bubbling dry N$_2$ for 0.5 hr and then allowed to reflux for 12 hr. The reaction mixture was cooled to room temperature and precipitated in 400 ml of hexanes with rigorous stirring. The resulting white solid was collected by filtration, washed with several portions of hexanes and dried under vacuum at 60° C. for 20 hr.

EXAMPLE 3

Synthesis of Poly(I-co-IV-co-VI)

The same procedure was used as in Example 2 with the following monomers: 2-trifluoromethanesulfonylaminoethyl methacrylate (I) (5.22 g, 0.02 mol), hydroxyadamantyl methacrylate (IV) (3.78 g, 0.016 mol), and 2-hydroxyethyl methacrylate (VI) (0.52 g, 0.004 mol), AIBN (0.197 g, 0.0012 mol), and dodecanethiol (0.081 g, 0.0004 mol).

EXAMPLE 4

Synthesis of Poly(I-co-XVII-co-IV-co-VI)

The same procedure was used as above in Example 2 with the following monomers: 2-trifluoromethanesulfonylaminoethyl methacrylate (I) (2.35 g, 0.009 mol), 2-methacryloyl-γ-butyrolactone (XVII) (1.53 g, 0.009 mol), hydroxyadamantyl methacrylate (IV) (2.12 g, 0.009 mol), and 2-hydroxyethyl methacrylate (VI) (0.39 g, 0.003 mol), AIBN (0.246 g, 0.0015 mol), and dodecanethiol (0.182 g, 0.0009 mol).

EXAMPLE 5

Lithographic Evaluation

For the purpose of lithographic experiments, a resist formulation containing poly(I-co-XVII-co-IV-co-VI) (Example 4) was prepared by combining the following materials, expressed in part by weight:

| | |
|---|---|
| Propylene glycol monomethyl ether acetate (solvent) | 80.68 |
| γ-butyrolactone (co-solvent) | 9.03 |
| Poly(I-co-XVII-co-IV-co-VI) | 9.16 |
| N,N,N,N-tetra(methoxymethyl)glycoluril (crosslinker) | 0.61 |
| 4-(1-butoxynaphthyl)tetrahydrothiophenium (photoacid generator) | 0.46 |
| Perfluorobutanesulfonate 2-phenylbenzimidazole (quencher) | 0.038 |

The resist formulation was spin-coated (for 30 seconds) onto an antireflective material layer (AR40, available from Shipley Company) applied on silicon wafers. The resist layer was soft-baked at 105° C. for 60 seconds on a vacuum hot plate to produce a film of about 0.24 μm thickness. The wafers were then exposed to 193 nm radiation (using ASML scanner, 0.75 NA). The exposure pattern was an array of lines and spaces of varying dimensions down to 0.08 μm. The exposed wafers were post-exposure baked on a vacuum hot plate at 105° C. for 90 seconds. The wafers were then (puddle) developed using 0.263 N TMAH developer for 60 seconds. The patterns were examined by scanning electron microscopy (SEM). Line/space pairs of 90 nm and above were well resolved.

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

We claim:

1. A negative resist composition comprising a polymer, the polymer comprising at least one fluorosulfonamide monomer unit having one of the following two formulae:

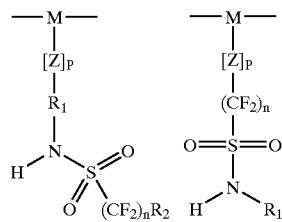

wherein M is a polymerizable backbone moiety which is

where R$_3$ is hydrogen, a linear or branched alkyl group of 1 to 20 carbons a semi- or perfluorinated linear or branched alkyl group of 1 to 20 carbons, or CN;

Z is a linking moiety selected from the group consisting of —C(O)O—, —C(O)—, —OC(O)—, —O—C(O)—C(O)—O—, and alkyl;

P is 0 or 1;

R$_1$ is a linear or branched alkyl group of 1 to 20 carbons;

R$_2$ is hydrogen, fluorine, a linear or branched alkyl group of 1 to 6 carbon or a semi- or perfluorinated linear or branched alkyl group of 1 to 6 carbons; and n is an integer from 1 to 6.

2. The negative resist composition of claim 1, wherein the fluorosulfonamide monomer unit is selected from the group consisting of:
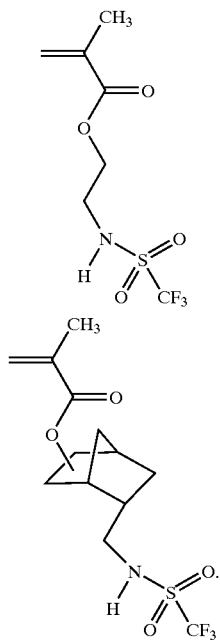
3. The negative resist composition of claim 1, wherein the polymer further comprises a co-monomer unit selected from the group consisting of:
(IV)
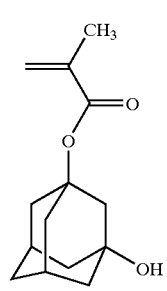
(V)
(VI)
-continued
(VII)
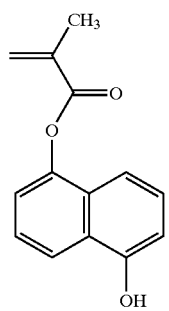
(VIII)
(IX)
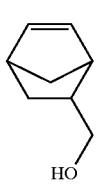
(X)
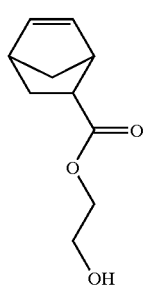
(XI)
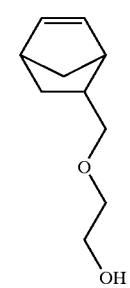
(XII)
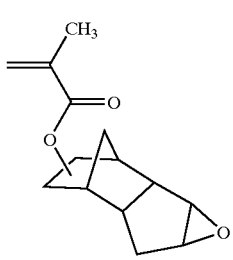

-continued (XIII)

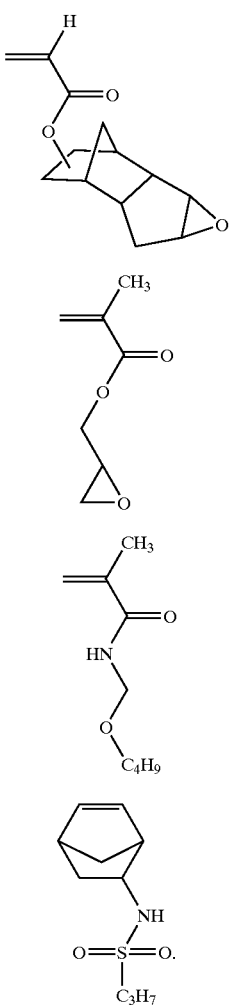

(XIV)

(XV)

(XVI)

4. The negative resist composition of claim 1, further comprising a radiation sensitive acid generator.

5. The negative resist composition of claim 4, wherein the radiation sensitive acid generator is selected from the group consisting of onium salts, succinimide derivatives, diazo compounds, and nitrobenzyl compounds.

6. The negative resist composition of claim 4, wherein the radiation sensitive acid generator is selected from the group consisting of 4-(1-butoxynaphthyl)tetrahydrothiophenium perfluorobutanesulfonate, triphenyl sulfonium perfluorobutanesulfonate, t-butylphenyl diphenyl sulfonium perfluorobutanesulfonate, 4-(1-butoxynaphthyl) tetrahydrothiophenium perfluorooctanesulfonate, triphenyl sulfonium perfluorooctanesulfonate, t-butylphenyl diphenyl sulfonium perfluorooctanesulfonate, di(t-butylphenyl) iodonium perfluorobutane sulfonate, di(t-butylphenyl) iodonium perfluorohexane sulfonate, di(t-butylphenyl) iodonium perfluoroethylcyclohexane sulfonate, di(t-buylphenyl) iodonium camphoresulfonate, and perfluorobutylsulfonyloxybicylo[2.2.1]-hept-5-ene-2,3-dicarboximide.

7. The resist composition of claim 1, further comprising at least one of a solvent, a crosslinking agent, a quencher, and a surfactant.

8. The resist composition of claim 7, wherein the crosslinking agent comprises two or more of the following moiety:

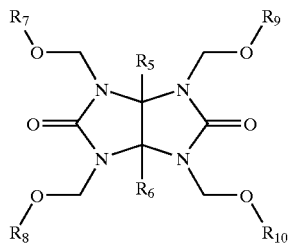

where $R_4$ represents hydrogen, or a linear or branched alkyl group, or an aromatic group.

9. The resist composition of claim 8, wherein the crosslinking agent comprises:

where $R_5$–$R_{10}$ each represent hydrogen, or a linear or branched alkyl group, or an aromatic group.

10. The resist composition of claim 9, wherein $R_5$–$R_{10}$ each represent hydrogen, or a linear or branched alkyl group of 1 to 8 carbons, or aryl hydrocarbon group of 6 to 9 carbons.

11. The resist composition of claim 7, wherein the resist composition comprises (i) about 1 to about 30 wt. % of the polymer, (ii) about 1 to about 30 wt. % of crosslinking agent, based on the total weight of the polymer, (iii) about 0.5 to about 20 wt. % of photoacid generator, based on the total weight of the polymer, and (IV) a solvent which is present in an amount of about 70 to about 99 wt. % of the composition.

12. The resist composition of claim 7, wherein the resist composition comprises (i) about 5 to about 15 wt. % of the polymer, (ii) about 3 to about 10 wt. % of crosslinking agent, based on the total weight of the polymer, (iii) about 0.5 to about 10 wt. % of photoacid generator, based on the total weight of the polymer, and (IV) a solvent which is present in an amount of about 85 to about 99 wt. % of the composition.

13. A method of forming a patterned material layer on a substrate, the method comprising:

(a) providing a substrate having a material layer on a surface;

(b) applying a resist composition to the substrate to form a resist layer on the material layer, the resist composition comprising a polymer, the polymer comprising at least one fluorosulfonamide monomer unit having one of the following two formulae:

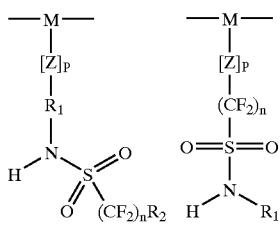

wherein M is a polymerizable backbone moiety which is

where $R_3$ is hydrogen, a linear or branched alkyl group of 1 to 20 carbons, a semi- or perfluorinated linear or branched alkyl group of 1 to 20 carbons, or CN;

Z is a linking moiety selected from the group consisting of —C(O)O—, —C(O)—, —OC(O)—, —O—C(O)—C(O)—O—, and alkyl;

P is 0 or 1;

$R_1$ is a linear or branched alkyl group of 1 to 20 carbons;

$R_2$ is hydrogen, fluorine, a linear or branched alkyl group of 1 to 6 carbons, or a semi- or perfluorinated linear or branched alkyl group of 1 to 6 carbons; and n is an integer from 1 to 6;

(c) patternwise exposing the resist layer to imaging radiation;

(d) removing portions of the resist layer not exposed to the imaging radiation in step (c) to create spaces in the resist layer corresponding to the pattern; and (e) removing portions of the material layer at the spaces formed in step (d), thereby forming the patterned material layer.

14. The method of claim 13, wherein portions of the resist layer are removed by contacting the resist layer with an aqueous alkaline developer solution, whereby portions of the resist layer not exposed to the imaging radiation are dissolved by the developer solution to create spaces in the resist layer corresponding to the pattern.

15. The method of claim 14, wherein the aqueous alkaline developer solution is 0.263 N tetramethyl ammonium hydroxide.

16. The method of claim 13, wherein the material layer is selected from the group consisting of ceramic, dielectric, metal and semiconductor layer.

17. The method of claim 13, wherein the imaging radiation is 193 nm radiation.

18. The method of claim 13, wherein the imaging radiation is 157 nm radiation.

19. The method of claim 13, wherein portions of the material layer are removed by etching into the material layer through spaces formed in the resist layer.

20. The method of claim 13, wherein portions of the material layer are removed using reactive ion etching.

21. The method of claim 13, wherein the resist composition further comprises a radiation sensitive acid generator.

22. The method of claim 21, wherein the radiation sensitive acid generator is selected from the group consisting of onium salts, succinimide derivatives, diazo compounds, and nitrobenzyl compounds.

23. The method of claim 21, wherein the radiation sensitive acid generator is selected from the group consisting of 4-(1-butoxynaphthyl)tetrahydrothiophenium perfluorobutanesulfonate, triphenyl sulfonium perfluorobutanesulfonate, t-butylphenyl diphenyl sulfonium perfluorobutanesulfonate, 4-(1-butoxynaphthyl) tetrahydrothiophenium perfluorooctanesulfonate, triphenyl sulfonium perfluorooctanesulfonate, t-butylphenyl diphenyl sulfonium perfluorooctanesulfonate, di(t-butylphenyl) iodonium perfluorobutane sulfonate, di(t-butylphenyl) iodonium perfluorohexane sulfonate, di(t-butylphenyl) iodonium perfluoroethylcyclohexane sulfonate, di(t-buylphenyl) iodonium camphoresulfonate, and perfluorobutylsulfonyloxybicylo[2.2.1]-hept-5-ene-2,3-dicarboximide.

24. The method of claim 13, wherein the resist composition further comprises at least one of a solvent, a crosslinking agent, a quencher, and a surfactant.

25. The method of claim 24, wherein the crosslinking agent comprises two or more of the following moiety:

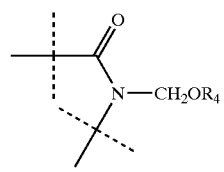

where $R_4$ represents hydrogen, or a linear or branched alkyl group, or an aromatic group.

26. The method of claim 25, wherein the crosslinking agent comprises:

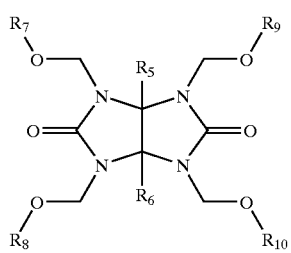

where $R_5$–$R_{10}$ each represent hydrogen, or a linear or branched alkyl group, or an aromatic group.

27. The method of claim 26, wherein $R_5$–$R_{10}$ each represent hydrogen, or a linear or branched alkyl group of 1 to 8 carbons, or aryl hydrocarbon group of 6 to 9 carbons.

* * * * *